US008993058B2

(12) United States Patent
Anthis et al.

(10) Patent No.: US 8,993,058 B2
(45) Date of Patent: Mar. 31, 2015

(54) METHODS AND APPARATUS FOR FORMING TANTALUM SILICATE LAYERS ON GERMANIUM OR III-V SEMICONDUCTOR DEVICES

(71) Applicant: Applied Materials, Inc., Santa Clara, CA (US)

(72) Inventors: Jeffrey W. Anthis, San Jose, CA (US); Khaled Z. Ahmed, Anaheim, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/010,639

(22) Filed: Aug. 27, 2013

(65) Prior Publication Data

US 2014/0065842 A1    Mar. 6, 2014

Related U.S. Application Data

(60) Provisional application No. 61/693,856, filed on Aug. 28, 2012.

(51) Int. Cl.
*C23C 16/40* (2006.01)
*C23C 8/12* (2006.01)
*H01L 21/02* (2006.01)

(52) U.S. Cl.
CPC ...... *H01L 21/0215* (2013.01); *H01L 21/02225* (2013.01)
USPC .............. 427/255.31; 427/255.393; 427/376.2

(58) Field of Classification Search
CPC ................................. C23C 16/40; C23C 8/12
USPC .......................... 427/255.31, 255.393, 376.2
See application file for complete search history.

(56) References Cited

U.S. PATENT DOCUMENTS

| 5,134,451 | A | 7/1992 | Katoh | |
|---|---|---|---|---|
| 2003/0054102 | A1* | 3/2003 | Horikawa | ................ 427/255.28 |
| 2005/0233526 | A1* | 10/2005 | Watanabe et al. | ............. 438/287 |
| 2008/0026553 | A1 | 1/2008 | Chua et al. | |
| 2009/0170340 | A1* | 7/2009 | Kitagawa et al. | ............. 438/766 |
| 2009/0202710 | A1 | 8/2009 | Marcadal et al. | |
| 2010/0203704 | A1* | 8/2010 | Inumiya et al. | ............... 438/424 |
| 2011/0147710 | A1 | 6/2011 | Dewey et al. | |
| 2013/0337659 | A1* | 12/2013 | Ahn et al. | ..................... 438/785 |

FOREIGN PATENT DOCUMENTS

| JP | 10-178170 | 6/1998 |
|---|---|---|
| KR | 10-2002-0064624 | 8/2002 |
| WO | WO 2004008544 | * 1/2004 |

OTHER PUBLICATIONS

Han, Jeong Hwan, et al., "Atomic layer deposition of tantalum oxide and tantalum silicate from TaCl5, SiCl4, and O3: growth behavior and film characteristics". Journal of Materials Chemisty C, 2013, 1, 5981-5989.*

(Continued)

*Primary Examiner* — Bret Chen
(74) *Attorney, Agent, or Firm* — Servilla Whitney LLC

(57) ABSTRACT

Described are apparatus and methods for forming tantalum silicate layers on germanium or III-V materials. Such tantalum silicate layers may have Si/(Ta+Si) atomic ratios from about 0.01 to about 0.15. The tantalum silicate layers may be formed by atomic layer deposition of silicon oxide and tantalum oxide, followed by interdiffusion of the silicon oxide and tantalum oxide layers.

16 Claims, 2 Drawing Sheets

(56) References Cited

OTHER PUBLICATIONS

Salam, K.M.A. et al., "Properties of Tantalum Silicate Thin Films Prepared by Metalorganic Decomposition". 159194 Conference: Gate Insulator, 2003. IWGI 2003: Extended Abstracts of International Workshop, pp. 1-6.*

PCT International Search Report and Written Opinion in PCT/US2013/056742, mailed Dec. 17, 2013, 13 pages.

Adelmann, C. et al., "Atomic-layer-deposited tantalum silicate as a gate dielectric for III-V MOS devices", *Microelectronic Engineering* 88 2011, 1098-1100.

* cited by examiner

METHODS AND APPARATUS FOR FORMING TANTALUM SILICATE LAYERS ON GERMANIUM OR III-V SEMICONDUCTOR DEVICES

CROSS-REFERENCE TO RELATED APPLICATIONS

This application claims the benefit under 35 U.S.C. §119(e) to U.S. Provisional Application No. 61/693,856, filed Aug. 28, 2012, the entire contents of which are incorporated herein by reference in their entirety.

FIELD

Embodiments of the present invention generally relate to the field of semiconductor manufacturing processes and devices, particularly to methods and apparatus for forming gate dielectric layers on Ge or III-V semiconductor devices.

BACKGROUND

Microelectronic devices are fabricated on a semiconductor substrate as integrated circuits in which various conductive layers are interconnected with one another to permit electronic signals to propagate within the device. An example of such a device is a complementary metal-oxide-semiconductor (CMOS) field effect transistor (FET) or MOSFET.

An exemplary FET or MOSFET includes a gate electrode on a gate dielectric layer on a surface of a silicon substrate. However, as CMOS technology is continuously miniaturized and the transistor count exponentially rises, overall power consumption is also increased, making performance per watt of energy consumption a key figure-of-merit for today's performance microprocessors. Narrow gap semiconductor-based materials such as Ge and III-V devices could enable the next generation of logic transistors operating below 0.5 V supply voltages as these materials have excellent low-field and high-field electron transport properties, thereby resulting in high-speed switching under low operating electric fields. Further scaling of tri-gate MOSFETs with new channel materials requires scaling of high-k/metal gate stacks with inversion layer thickness ($T_{inv}$) below 1.3 nm. However, current gate stack materials do not meet these requirements for $T_{inv}$.

Therefore, there is a need for new materials for the gate stack of Ge and III-V channel transistors, as well as methods and apparatus for forming such layers.

SUMMARY OF THE INVENTION

One aspect of the current invention relates to a method of processing a substrate to provide a tantalum silicate layer on a surface of the substrate. In various embodiments the method comprises depositing a silicon oxide layer on the substrate, depositing a tantalum oxide layer on the silicon oxide layer; and diffusing the tantalum oxide layer into the silicon oxide layer to provide a tantalum silicate layer. In one or more embodiments, the tantalum silicate layer has a Si/(Ta+Si) ratio in the range from about 0.01 to about 0.15. In some embodiments, the Si/(Ta+Si) ratio is in the range from about 0.03 to about 0.10. The substrate may have a germanium or III-V semiconductor surface.

According to one or more embodiments, the tantalum oxide layer may be diffused by annealing the substrate. Exemplary annealing temperatures may be in the range from about 500° C. to about 1000° C. In other embodiments, the tantalum oxide and silicon oxide layer are interdiffused without annealing.

One or more embodiments provide that the tantalum oxide layer is tantalum-rich prior to diffusion. In some embodiments, the tantalum oxide layer has a Ta:O ratio of about 2:3. Alternatively, the tantalum oxide layer may be stoichiometric.

The tantalum silicate layer may have a predetermined thickness. In some embodiments, the tantalum silicate layer has a thickness less than about 2.5 nm.

According to some embodiments, one or more of the silicon oxide layer and the tantalum oxide layer is deposited via atomic layer deposition.

The method may further comprise additional steps, such as atomic hydrogen cleaning the substrate surface prior to depositing the silicon oxide layer. In one or more embodiments, the substrate is not exposed to air between atomic hydrogen cleaning and depositing the silicon oxide layer and the substrate is not exposed to ambient air between depositing the silicon oxide layer and depositing the tantalum oxide layer.

Another aspect of the present invention pertains to a method of processing a substrate to provide a tantalum silicate layer on a substrate having a germanium or III-V semiconductor surface. In embodiments of this aspect, the method comprises depositing a silicon oxide layer on the substrate having a germanium or III-V semiconductor surface via an atomic layer deposition process, depositing a tantalum oxide layer on the silicon oxide layer via an atomic layer deposition process, and annealing the substrate to provide a tantalum silicate layer having a Si/(Ta+Si) ratio in the range from about 0.01 to about 0.15. In some embodiments, the Si/(Ta+Si) ratio is in the range from about 0.03 to about 0.10.

In one or more embodiments of this aspect, the tantalum oxide layer is tantalum-rich. In some embodiments, the tantalum oxide layer has a Ta:O ratio of about 2:3. In other embodiments, the tantalum oxide layer is stoichiometric.

The annealing temperature may be in the range from about 500° C. to about 1000° C.

Yet another aspect of the present invention pertains to a substrate processing apparatus for forming a tantalum silicate layer having a predetermined Si/(Ta+Si) ratio. In embodiments of this aspect, the substrate processing apparatus comprises a first processing chamber to clean a substrate having a germanium or III-V semiconductor surface, a second processing chamber in communication with the first processing chamber to deposit a silicon oxide layer on the substrate, a third processing chamber in communication with the second processing chamber to deposit a tantalum oxide layer on the substrate, and a control system in communication with the first, second and third processing chambers to form a tantalum silicate layer having a predetermined Si/(Ta+Si) ratio. The predetermined Si/(Ta+Si) ratio may be in the range from about 0.01 to about 0.15. The first, second and third processing chambers may be in communication under load lock conditions, i.e. under vacuum.

In one or more embodiments, the apparatus further comprises a fourth processing chamber in communication with the third processing chamber to anneal the substrate.

In some embodiments, the second and third processing chambers are atomic layer deposition chambers.

The foregoing has outlined rather broadly certain features and technical advantages of the present invention. It should be appreciated by those skilled in the art that the specific embodiments disclosed may be readily utilized as a basis for modifying or designing other structures or processes within the scope present invention. It should also be realized by those skilled in the art that such equivalent constructions do not depart from the spirit and scope of the invention as set forth in the appended claims.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
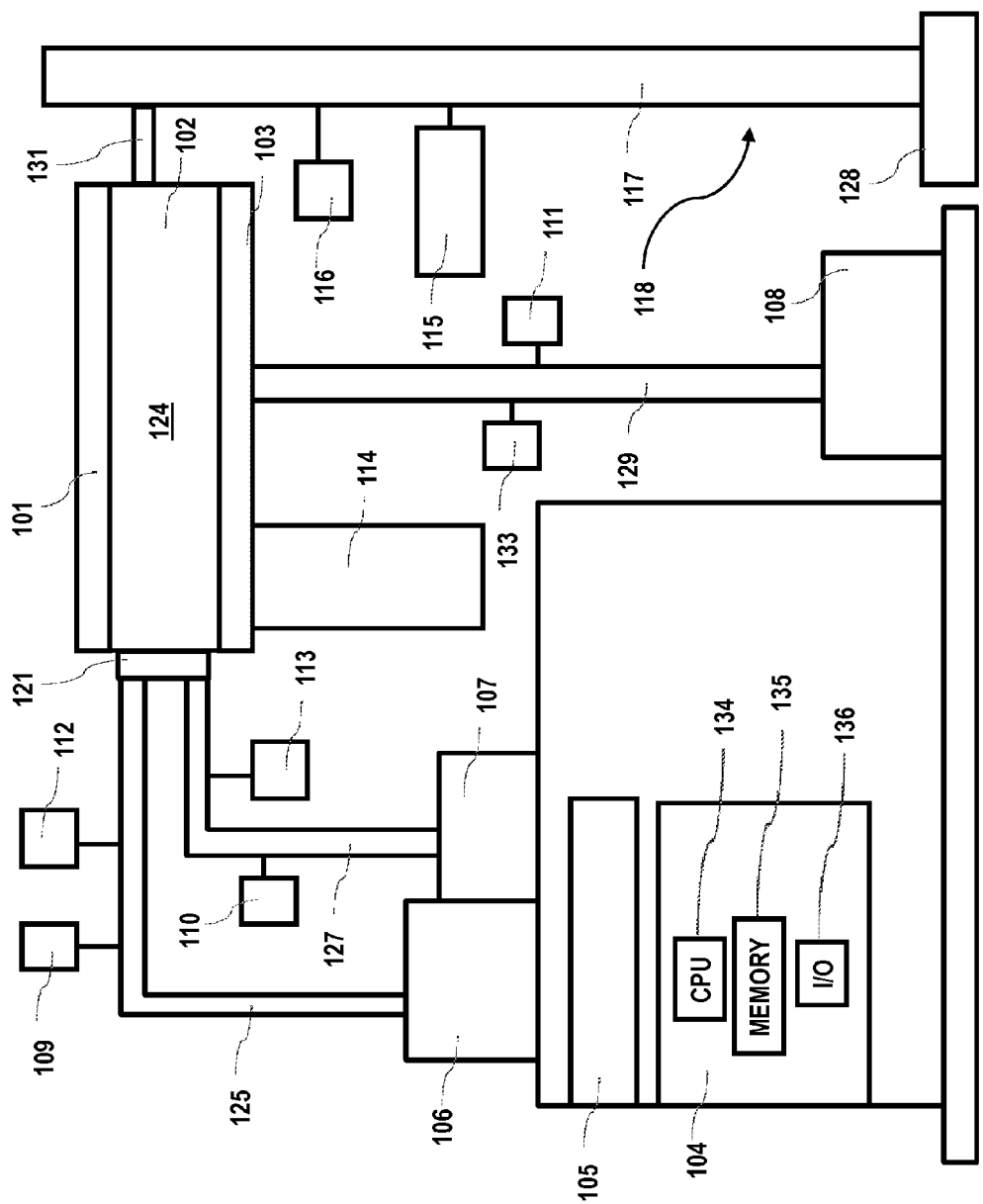
FIG. 1 illustrates a schematic of an apparatus in accordance with one or more embodiments of the invention.

In order to avoid the drawbacks of other gate stack materials, new methods of forming gate stack materials for Ge and III-V semiconductor devices are provided. Specifically, embodiments of the invention provide methods and apparatus for forming Ta-rich $TaSiO_x$ layers for Ge and III-V semiconductor devices. $TaSiO_x$ may be used as a common gate dielectric for Ge and III-V materials, thus enabling high performance/low power CMOS devices that use Ge channel p-MOSFET and III-V channel n-MOSFET.

Silicon and silicon dioxide ($SiO_2$) are both candidate materials for the interfacial layer between the Ge or III-V materials and the high-k dielectric. However, as atomic layer deposition (ALD) of silicon is difficult on substrates having Ge and III-V surfaces, embodiments of the present invention pertain to the deposition of $SiO_2$, which is easier to deposit than pure silicon films.

Furthermore, hafnium dioxide ($HfO_2$) and tantalum pentoxide ($Ta_2O_5$) have similar dielectric constants, but the use of $HfO_2$ on $SiO_2$ has a limit in EOT scaling of 1.3 nm. However, it has been found that by depositing a silicon oxide layer and then depositing a tantalum oxide layer, the tantalum oxide layer can at least partially consume the silicon oxide layer to provide a tantalum silicate layer. If the silicon oxide layer is entirely consumed, the interfacial layer between the channel and the high-k dielectric layer will have a thickness of essentially zero. In one or more embodiments, this process may enable very thin electrical oxide thicknesses (i.e. $T_{inv}$<1.2 nm).

Accordingly, one aspect of the present invention relates to a method of processing a substrate to provide a tantalum silicate layer ($TaSiO_x$) on the surface of the substrate. As used herein, a "substrate surface," refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

According to one or more embodiments, the substrate has a germanium or III-V material surface.

One aspect of the present invention relates to a method of forming a tantalum silicate layer on a substrate having a germanium or III-V material on its surface. This tantalum silicate layer may act as both the interfacial layer and the dielectric layer for the gate stack. In embodiments of this aspect, the method comprises depositing a silicon oxide layer on the substrate having a germanium or III-V semiconductor surface, depositing a tantalum oxide layer on the silicon oxide layer, and then interdiffusing the tantalum oxide layer and silicon oxide layer to provide a tantalum silicate layer.

According to one or more embodiments, the tantalum silicate layer has a Si/(Ta+Si) atomic ratio less than 0.3, such as in the range from about 0.01 to about 0.15. While not wishing to be bound by any particular theory, it is believed that having higher amounts of silicon, i.e. at Si/(Ta+Si) ratios at or above 0.3, is undesirable because it may lower the k value of the gate material. In some embodiments, the Si/(Ta+Si) ratio is in the range from about 0.03 to about 0.10. The Si/(Ta+Si) ratio may be varied by varying the respective thicknesses of the silicon oxide layer and tantalum oxide layer before diffusion.

In some embodiments, the substrate is annealed to allow interdiffusion of the tantalum oxide and silicon oxide layers. Suitable annealing temperatures may be in the range from about 500° C. to about 1000° C. Exemplary annealing temperatures may be about 500° C., about 600° C., about 700° C., about 800° C., about 900° C. or about 1000° C. However, in embodiments with a sub-stoichiometric amount of oxygen present in the tantalum oxide layer such that the layer is Ta-rich (i.e. the tantalum oxide layer has a formula of $Ta_2O_{<5}$), then the thermodynamic driving force of Ta—O bond formation may make high-temperature annealing unnecessary. Thus, if a Ta-rich layer is used, little or no annealing may be necessary to drive the diffusion.

Accordingly, in one or more embodiments, the tantalum oxide layer deposited on the substrate is tantalum-rich. In one or more embodiments, the Ta:O atomic ratio is in the range from about 1:1 to about 1:2. In some embodiments, the tantalum oxide layer has a Ta:O atomic ratio of about 2:3, i.e. has a chemical formula of $Ta_2O_3$.

However, in other embodiments, the tantalum oxide layer is stoichiometric, i.e. has a Ta:O ratio of about 2:5.

An atomic layer deposition process allows for precise control of the thickness of the silicon oxide layer and/or the tantalum oxide layer. If one or both of the films are deposited using an ALD process, then the films may be thin and conformal. Accordingly, in some embodiments, both the silicon oxide layer and the tantalum oxide layer are deposited in ALD processes. A tantalum silicate film resulting from ALD silicon oxide and ALD tantalum oxide may have a lower thickness and better conformality than a tantalum silicate film formed by other methods. However, in alternate embodiments, one or both of the silicon oxide layer and the tantalum oxide layer is deposited by chemical vapor deposition (CVD), physical vapor deposition (PVD), or any other suitable deposition process.

In one or more embodiments, the deposition of the silicon oxide and tantalum oxide layers is controlled to provide a tantalum silicate layer of a desired thickness. In various embodiments, the tantalum silicate layer may have a thickness less than about 10 nm, about 7 nm, about 5 nm, about 4 nm, about 3 nm, about 2.5 nm, about 2 nm, about 1.5 nm, about 1 nm or about 0.5 nm. In some embodiments, the thickness of the silicon oxide layer before interdiffusion is less than about 1.5 nm, about 1.0 nm or 0.5 nm.

Exemplary precursors for forming silicon oxide by ALD include tetraethyl orthosilicate (TEOS) and tris(dimethylamino)silane, among others. Suitable oxidant co-reactants include, but are not limited to, $H_2O$ and $O_3$.

Exemplary precursors for forming tantalum oxide by ALD include, but are not limited to, pentakis(ethoxy)tantalum and pentakis(dimethylamino) tantalum (PDMAT). Again, suitable oxidants include, but are not limited to, $H_2O$ and $O_3$.

In one or more embodiments, the method is performed under vacuum conditions, i.e. under reduced pressure and without exposing the substrate to ambient air. According to one or more embodiments, inert gases such as nitrogen may be present in the chamber.

In a typical ALD process, alternating pulses or flows of "A" precursor and "B" precursor can be used to deposit a film, for example, in a pulsed delivery of multiple cycles of pulsed precursors and co-reactants, for example, A precursor pulse, B precursor pulse, A precursor pulse, B precursor pulse, A precursor pulse, B precursor pulse, etc. The alternating exposure of the surface to reactants "A" and "B" is continued until the desired thickness film is reached. However, instead of pulsing the reactants, the gases can flow simultaneously from a gas delivery head or nozzle and the substrate and/or gas delivery head can be moved such that the substrate is sequentially exposed to the gases. Of course, the aforementioned ALD cycles are merely exemplary of a wide variety of ALD process cycles in which a deposited layer is formed by alternating layers of precursors and co-reactants In some embodiments, the silicon oxide layer and/or the tantalum oxide layer may be formed during a plasma enhanced atomic layer deposition (PEALD) process that provides sequential pulses of precursors and plasma. In specific embodiments, the co-reactant may involve a plasma. In other embodiments involving the use of plasma, during the plasma step the reagents are generally ionized during the process, though this might occur only upstream of the deposition chamber such that ions or other energetic or light emitting species are not in direct contact with the depositing film, this configuration often termed a remote plasma. Thus in this type of PEALD process, the plasma is generated externally from the processing chamber, such as by a remote plasma generator system. During PEALD processes, a plasma may be generated from a microwave (MW) frequency generator or a radio frequency (RF) generator. Although plasmas may be used during the deposition processes disclosed herein, it should be noted that plasmas are not required. Indeed, other embodiments relate to deposition processes under very mild conditions without a plasma.

According to one or more embodiments, the substrate is subjected to further processing prior to or after forming the tantalum silicate layer, or between depositing the silicon oxide layer and the tantalum oxide layer. This further processing can be performed in the same chamber as any of the deposition chambers, or can be performed in one or more separate processing chambers. In one embodiment, a silicon oxide layer is deposited in a first chamber and the substrate having the silicon oxide layer thereon is moved from the first chamber to a separate, second chamber for further processing. This second chamber may be a tantalum oxide deposition chamber. The substrate having the silicon oxide layer thereon can be moved directly from the first chamber to the separate processing chamber, or it can be moved from the first chamber to one or more transfer chambers, and then moved to the desired separate processing chamber. Alternatively, the silicon oxide layer and the tantalum oxide layer may be formed in the same deposition chamber, and then the substrate having both layers is transferred to subsequent processing chambers.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon oxide layer or tantalum oxide layer on the surface of the substrate. According to one or more embodiments, a purge gas is injected at the exit of the deposition chamber to prevent reactants from moving from the deposition chamber to the transfer chamber and/or processing chamber. Thus, the flow of inert gas forms a curtain at the exit of the chamber.

Other processing chambers can include, but are not limited to, deposition chambers, cleaning chambers and annealing chambers. According to one or more embodiments, a tantalum oxide dielectric layer is deposited on the silicon oxide layer by a deposition process, such as chemical vapor deposition (CVD) or atomic layer deposition (ALD). In a particular embodiment, the tantalum oxide layer is deposited on the silicon oxide layer via an atomic layer deposition process.

According to one or more embodiments, the substrate having the germanium or III-V semiconductor surface is cleaned prior to depositing the silicon oxide layer. In some embodiments, the cleaning process comprises atomic hydrogen cleaning. In order to prevent contamination of the cleaned substrate surface, the substrate may be under load lock conditions, i.e. the substrate is not exposed to air between atomic hydrogen cleaning and depositing the silicon oxide layer. After depositing the silicon oxide layer, the substrate may be kept under load lock conditions until the tantalum oxide layer is deposited.

Another aspect of the invention relates to a method of processing a substrate, the method comprising depositing a silicon oxide layer on a substrate having a germanium or III-V semiconductor surface via an atomic layer deposition process, depositing a tantalum oxide layer on the silicon oxide layer via an atomic layer deposition process, and annealing the substrate to provide a tantalum silicate layer. Embodiments of this aspect may have any of the features described for the first aspect. In one or more embodiments, the tantalum silicate layer has a Si/(Ta+Si) atomic ratio in the range from about 0.01 to 0.15. In some embodiments, the Si/(Ta+Si) ratio is about 0.03 to about 0.10.

Again, the tantalum oxide layer may either be stoichiometric or Ta-rich. In one or more embodiments, the tantalum oxide layer has a Ta:O atomic ratio in the range from about 1:1 to about 1:2. In some embodiments, the Ta:O atomic ratio is about 2:3.

Yet another aspect of the invention pertains to an apparatus for performing a process according to any of the embodiments described above. In particular, provided is an apparatus for forming a tantalum silicate layer on a substrate having a germanium or III-V semiconductor surface. In one or more embodiments, the apparatus comprises one or more processing chambers. Each processing chamber may have a chamber body, one or more injectors, and a control system. This apparatus will provide a supply of precursors to the substrate surface to deposit a silicon oxide layer and/or a tantalum oxide layer on the substrate. The apparatus may also comprise components such as a temperature controller or pressure controller.

FIG. 1 illustrates one embodiment in accordance with this aspect of the invention. Chamber body includes a chamber lid 101, chamber wall 102, and a chamber plate 103. Chamber lid 101, chamber wall 102 and chamber plate 103 define a substrate process area 124 where the deposition reaction occurs on a substrate surface. Lifting mechanism 114 raises and lowers the substrate so that the substrate can be moved in and out of the substrate process area with a robot blade or other suitable transfer mechanism. The apparatus may include a transfer valve (not shown) to move a substrate from the process area to a transfer chamber under controlled pressure to prevent exposure of the substrate to ambient air.

A first precursor is provided by precursor supply 106, which is delivered into the process area 124 via conduit 125, which can be any suitable conduit such as piping or channel to deliver the precursor at an appropriate flow rate to the process area 124 through injector 121. The first and second precursors may be dispersed from the same injector, or multiple injectors may be used to prevent mixing before reaching the substrate process area. Any appropriate flow configuration may be used for flowing the precursors into the substrate process area, including cross flow or top-down flow. The injectors 121 may comprise any means for dispersing the reactants into the substrate process area, including a showerhead or baffle plate.

The precursor supplies can be any suitable sources of the precursors, including a cylinder of the precursor gas or a generation system to generate the precursor gas. The flow of the first precursor gas to the chamber is regulated by precursor valve 109 and precursor flow controller 112, which can communicate with chamber controller 104. The flow controller 112 can be a mass flow or volume flow controller. A second precursor is provided by precursor supply 107 and delivered to the process area 124 via conduit 127 through the injector 121. The flow of the second precursor is regulated by precursor valve 110 and precursor controller 113, which can be a mass flow or volume flow controller. Valve 110 and flow controller 113 can be in communication with chamber controller 104. As shown in FIG. 1, the first and second precursors may be delivered to the chamber separately via separate conduits 125 and 127. However, it is within the scope of the invention to mix the precursors prior to introducing the gases into the chamber, and deliver them in a single conduit.

An inert gas supply 108 can be used to provide an inert gas as a purge gas via inert gas conduit 129 to remove reactants and/or byproducts from the chamber body via the exhaust system 118. In addition, the inert gas can be used as a carrier gas to deliver reactants into the chamber by mixing the inert gas with one or both the first precursor supply or the second precursor supply. If the inert gas is to be used as a carrier gas, the inert gas conduit would include appropriate interconnects (not shown) to connect inert gas conduit 129 with one or both of precursor gas conduit 125 and/or precursor conduit 127. Appropriate interconnects would include valves and/or flow controllers (not shown) that would be in communication with chamber controller 104. Inert gas valve 111 regulates the flow of inert gas to the chamber body. A flow controller 133 may also be used to regulate the flow of inert gas into the chamber.

A temperature controller 105 may control the various heating and cooling elements of the apparatus, such as heating and/or cooling elements for the chamber plate 103. The temperature controller may maintain the temperature during the deposition at or below a maximum temperature. In various embodiments, the maximum temperature may be 800° C., 700° C., 600° C., 500° C., 400° C., 350° C., 300° C., 250° C., 200° C., 150° C., 100° C., 50° C. or even room temperature.

In one or more embodiments, the apparatus may comprise an exhaust system 118 for removing gases from the chamber body. A pump 128 in flow communication with exhaust line 117 connected to the chamber via exhaust conduit 131 removes excess reactants and byproducts of the silicon oxide layer and/or tantalum oxide layer formation process from the process area 124 when the layer has been deposited. An isolation valve 116 can be used to isolate the chamber body from the pump 128. A throttle valve 115 can be used to regulate the pressure in the chamber body to achieve the desired pressure in the process area 124.

In one or more embodiments, various elements of the apparatus such as the precursor flow controller 112, the precursor flow controller 113, and the temperature controller 105 are controlled by the chamber controller 104, which provides I/O control of the apparatus. In specific embodiments, the chamber controller 104 communicates with the various other control elements to control the thickness of the silicon oxide layer and/or tantalum oxide layer, or the resulting tantalum silicate layer. The chamber controller 104 may control the quantity of precursors delivered to the process chamber area, such that the layer formed has a predetermined thickness. The chamber controller 104 may also control other factors that influence the thickness of the silicon oxide layer and/or tantalum oxide layer, such as the temperature and/or pressure in the process area.

In some embodiments, the thickness of the silicon oxide layer, tantalum oxide layer or resulting tantalum silicate layer may be a predetermined thickness that is related to a desired property of the gate stack. According to one or more embodiments, the predetermined thickness of the silicon oxide layer is less than about 2 nm. In some embodiments, the predetermined thickness of the silicon oxide layer is less than about 1 nm. The tantalum silicate layer may also have a predetermined thickness, such as less than about 10 nm, about 7 nm, about 5 nm, about 4 nm, about 3 nm, about 2.5 nm, about 2 nm, about 1.5 nm, about 1 nm or about 0.5 nm.

The chamber controller 104 can include a CPU 134, a memory 135 and an I/O 136 in wired or wireless communication with the various controllers. The CPU 134 sends and receives signals to the precursor flow controller 112 and the precursor flow controller 113 to control the flow of the first and second precursors to the injector 121. The CPU 134 also sends and receives signals to the throttle valve 115 to control pressure in the substrate process area so that the throttle valve 115 operates as a pressure control valve for the apparatus. The CPU 134 can also be in communication with the isolation valve 116 and pump 128 to further control the flow of exhaust from the chamber.

The CPU may be one of any forms of a computer processor that can be used in an industrial setting for controlling various chambers and sub-processors. Thus, the CPU can be coupled to the memory 135 which may be one or more of readily available memory such as random access memory (RAM), read only memory (ROM), flash memory, compact disc, floppy disk, hard disk, or any other form of local or remote digital storage. Support circuits (not shown) can be coupled to the CPU to support the CPU in a conventional manner. These circuits include cache, power supplies, clock circuits, input/ output circuitry, subsystems, and the like. The CPU 134 and the memory 135 are coupled to an appropriate I/O circuit 136 to communicate with the various controllers of the apparatus.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and exposed to the deposition gases at different positions.

The control system may further comprise a computer-readable medium having a set of machine-executable instructions. These instructions may be such that, when executed by the CPU, cause the apparatus to perform any of the methods previously described. In one embodiment, the instructions relate to a method comprising exposing a surface of the substrate to one or more precursors to form a silicon oxide layer or exposing the surface of the substrate to one or more precursors to form a tantalum oxide layer. The instructions may also relate to exposing the substrate surface to co-reactants such as oxidants. The control system may control the deposition of the silicon oxide and tantalum oxide layers such that the resulting tantalum silicate layer has a Si/(Ta+Si) ratio from about 0.01 to about 0.15 or from about 0.03 to about 0.10.

In another embodiment, the instructions relate to a method comprising: exposing a surface of the substrate to one or more precursors to provide a silicon oxide layer; moving the substrate having the silicon oxide layer thereon from the process area to a transfer chamber; moving the substrate from the transfer chamber to a deposition chamber; and depositing a tantalum oxide layer on the silicon oxide layer.

The apparatus may further comprise other chambers in addition to the silicon oxide and tantalum oxide deposition chamber(s). These chambers can include transfer chambers and additional processing chambers, such as deposition chambers, cleaning chambers and annealing chambers. These chambers may be interconnected in a "cluster tool system."

Generally, a cluster tool is a modular system comprising multiple chambers which perform various functions including substrate center-finding and orientation, degassing, annealing, deposition and/or etching. According to an embodiment of the present invention, a cluster tool includes at least a first chamber configured to deposit the silicon oxide layer. The multiple chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein.

Figure 2:
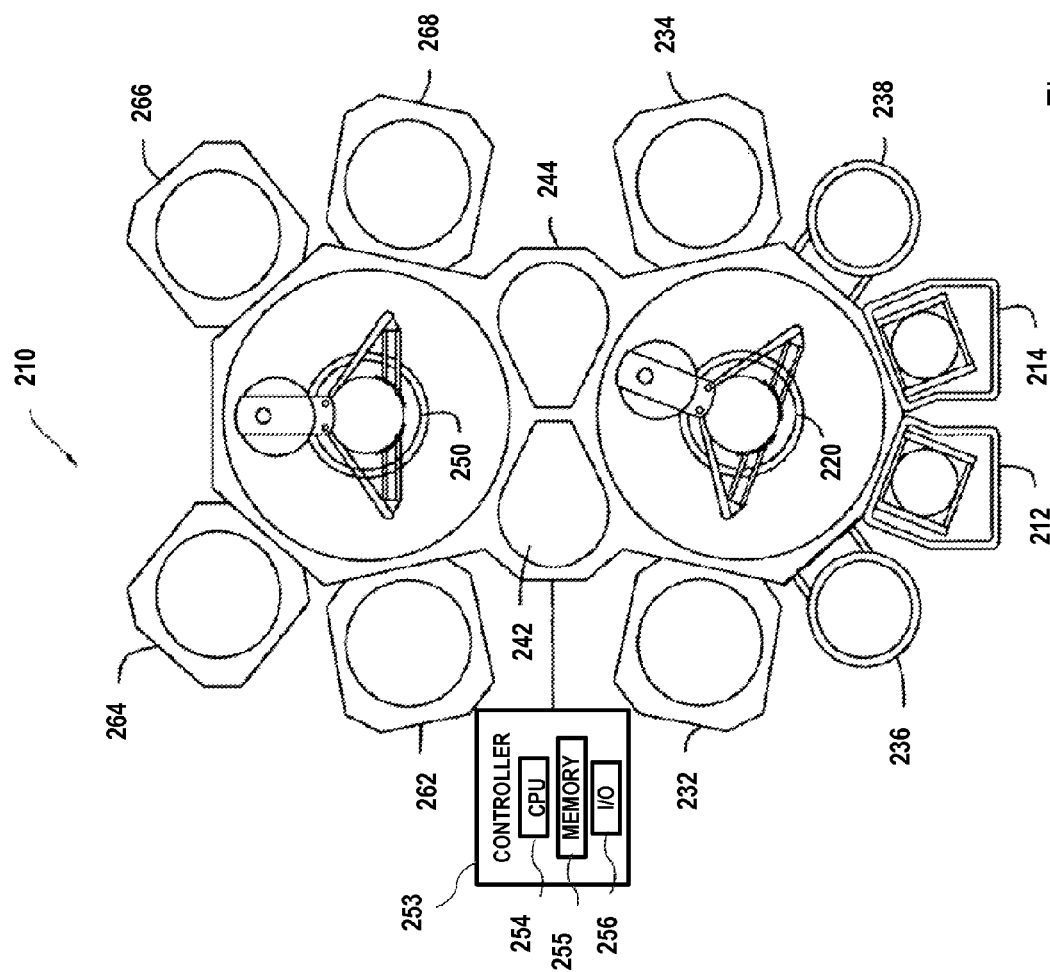
FIG. 2 illustrates a schematic of a cluster tool system in accordance with one or more embodiments of invention.

FIG. 2 shows an example of a cluster tool or multi-chamber processing system 210 that can be used in conjunction with an aspect of the invention. The processing system 210 can include one or more load lock chambers 212, 214 for transferring substrates into and out of the system 210. Typically, since the system 210 is under vacuum, the load lock chambers 212, 214 may "pump down" substrates introduced into the system 210. A first robot 220 may transfer the substrates between the load lock chambers 212, 214, and a first set of one or more substrate processing chambers 232, 234, 236, 238. Each processing chamber 232, 234, 236, 238, may be configured to perform a number of substrate processing operations. For example, processing chamber 232 can be an etch processor designed to practice an etch process, and processing chamber 234 can be a deposition reaction chamber for performing ALD or CVD, or a rapid thermal processing (RTP) or RadOx® chamber designed to form a thermal oxide layer on a substrate. Processing chambers 236, 238 may also be configured to further provide, for example, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes.

The first robot 220 can also transfer substrates to/from one or more transfer chambers 242, 244. The transfer chambers 242, 244 can be used to maintain vacuum conditions while allowing substrates to be transferred within the system 210. A second robot 250 can transfer the substrates between the transfer chambers 242, 244 and a second set of one or more processing chambers 262, 264, 266, 268. Similar to processing chambers 232, 234, 236, 238, the processing chambers 262, 264, 266, 268 can be configured to perform a variety of substrate processing operations, including etch processes, in addition to cyclical layer deposition (CLD), atomic layer deposition (ALD), chemical vapor deposition (CVD), physical vapor deposition (PVD), epitaxial deposition, etch, pre-clean, chemical clean, thermal treatment such as RTP/RadOx®, plasma nitridation, degas, and orientation. Any of the substrate processing chambers 232, 234, 236, 238, 262, 264, 266, 268 may be removed from the system 210 if not needed.

By carrying out this process in a chamber on a cluster tool, surface contamination of the substrate with atmospheric impurities is avoided and a thin, conformal film of tantalum silicate may be provided.

Applied Materials, Inc. of Santa Clara, Calif. offers a substrate processing chamber which includes a process called RadOx® to form thin silicon dioxide layers for CMOS transistor gates. The RadOx® process heats the substrate with lamps and injects hydrogen and oxygen into a process chamber. These gases form radicals when they strike the surface of the substrate. The radicals are more reactive than neutral species, providing a faster layer growth rate than would be available with steam processes known as In Situ Steam Generated (ISSG) oxide growth.

Suitable etch or clean chambers can be configured for wet or dry etch, reactive ion etch (RIE), or the like. Exemplary etch chambers include the SICONI™ Producer®, or Carina™ chambers, also available from Applied Materials, Inc. of Santa Clara, Calif. One non-limiting, exemplary dry etch process may include ammonia ($NH_3$) or nitrogen trifluoride ($NF_3$) gas, or an anhydrous hydrogen fluoride (HF) gas mixture with a remote plasma, which condenses on $SiO_2$ at low temperatures (e.g., about 30° C.) and reacts to form a compound which can be sublimated at moderate temperature (e.g., >100° C.) to etch $SiO_2$. Such an exemplary etch process can diminish over time and eventually saturate to a point where no further etching occurs unless portions of the compound are removed (for example, by the sublimation process described above). The etch process can be controlled using the above mechanism and/or by a timed etch process (e.g., etching for a predetermined period of time). Exemplary wet etch processes may include hydrogen fluoride (HF) or the like. Exemplary plasma or remote plasma etch processes may include one or more etchants such as carbon tetrafluoride ($CF_4$), trifluoromethane ($CHF_3$), sulfur hexafluoride ($SF_6$), hydrogen ($H_2$), or the like, and may be performed with or without a heating chuck.

In specific embodiments, a process is performed including a first step in which the robot 220 moves a substrate from one of the load lock chambers 212, 214 to a deposition chamber to form a silicon oxide layer. Alternatively, the substrate surface may be cleaned prior to depositing the silicon oxide layer, such as by atomic hydrogen cleaning. After the silicon oxide layer is deposited, the substrate can be moved in a second step back into a load lock chamber 212, 214 or directly transferred to a deposition chamber to form a tantalum oxide layer. After depositing a tantalum oxide, the substrate can then be moved to other chambers for subsequent processing or can be moved to a load lock chamber 212, 214.

Controller 253 may be one of any form of general-purpose data processing system that can be used in an industrial setting for controlling the various subprocessors and subcontrollers. Generally, controller 253 includes a central processing unit (CPU) 254 in communication with memory 255 and input/output (I/O) circuitry 256, among other common components.

In one exemplary process, a substrate having a germanium or III-V material surface is cleaned by atomic hydrogen cleaning, then transferred under load lock conditions to a silicon oxide deposition chamber. A silicon oxide layer is formed on the cleaned substrate surface by an atomic layer deposition process. The substrate is then transferred under load lock conditions to another deposition chamber, wherein a tantalum oxide layer is formed on the silicon oxide layer, such as by an atomic layer deposition process. By integrating these three in-situ processes in a cluster tool configuration, the silicon oxide layer and tantalum oxide can be formed without any exposure to ambient air or other contaminants. The deposition chambers may also be clustered with further processing chambers, such as an annealing chamber for interdiffusing the silicon oxide and tantalum oxide layers to provide a tantalum silicate layer.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments. The order of description of the above method should not be considered limiting, and methods may use the described operations out of order or with omissions or additions.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method of processing a substrate comprising:
   depositing a silicon oxide layer on a substrate having a germanium or III-V semiconductor surface;
   depositing a tantalum oxide layer on the silicon oxide layer; and
   diffusing the tantalum oxide layer into the silicon oxide layer to provide a tantalum silicate layer having a Si/(Ta+Si) ratio in the range from about 0.01 to about 0.15.

2. The method of claim 1, wherein diffusing the tantalum oxide layer comprises annealing the substrate.

3. The method of claim 1, wherein the tantalum oxide layer is tantalum-rich.

4. The method of claim 3, wherein the tantalum oxide layer has a Ta:O ratio of about 2:3.

5. The method of claim 1, wherein the tantalum oxide layer is stoichiometric.

6. The method of claim 1, wherein the Si/(Ta+Si) ratio is in the range from about 0.03 to about 0.10.

7. The method of claim 1, wherein the tantalum silicate layer has a thickness less than about 2.5 nm.

8. The method of claim 1, wherein one or more of the silicon oxide layer and the tantalum oxide layer is deposited via atomic layer deposition.

9. The method of claim 1, further comprising atomic hydrogen cleaning the substrate surface prior to depositing the silicon oxide layer.

10. The method of claim 9, wherein the substrate is not exposed to air between atomic hydrogen cleaning and depositing the silicon oxide layer and the substrate is not exposed to ambient air between depositing the silicon oxide layer and depositing the tantalum oxide layer.

11. A method of processing a substrate comprising:
    depositing a silicon oxide layer on a substrate having a germanium or III-V semiconductor surface via an atomic layer deposition process;
    depositing a tantalum oxide layer on the silicon oxide layer via an atomic layer deposition process; and
    annealing the substrate to provide a tantalum silicate layer having a Si/(Ta+Si) ratio in the range from about 0.01 to about 0.15.

12. The method of claim 11, wherein the tantalum oxide layer is tantalum-rich.

13. The method of claim 12, wherein the tantalum oxide layer has a Ta:O ratio of about 2:3.

14. The method of claim 11, wherein the tantalum oxide layer is stoichiometric.

15. The method of claim 11, wherein the Si/(Ta+Si) ratio is in the range from about 0.03 to about 0.10.

16. The method of claim 11, wherein the substrate is annealed at a temperature in the range from about 500° C. to about 1000° C.

* * * * *